(12) United States Patent
Feldman et al.

(10) Patent No.: US 9,871,602 B2
(45) Date of Patent: Jan. 16, 2018

(54) PHASE SHIFTER CHIP RADIO FREQUENCY SELF-TEST

(71) Applicant: Google Inc., Mountain View, CA (US)

(72) Inventors: Arnold Feldman, San Francisco, CA (US); Benjamin Joseph Mossawir, San Carlos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/244,241

(22) Filed: Aug. 23, 2016

(65) Prior Publication Data

US 2017/0041087 A1 Feb. 9, 2017

Related U.S. Application Data

(62) Division of application No. 14/817,570, filed on Aug. 4, 2015, now Pat. No. 9,455,855.

(51) Int. Cl.
*H04B 3/46* (2015.01)
*H04B 17/30* (2015.01)
(Continued)

(52) U.S. Cl.
CPC ............ *H04B 17/30* (2015.01); *H01Q 3/267* (2013.01); *H01Q 3/34* (2013.01); *H03G 1/0017* (2013.01);
(Continued)

(58) Field of Classification Search
USPC ..... 375/219, 220, 221, 222, 240.26, 240.27, 375/243, 259, 284, 285, 278, 294, 316,
(Continued)

(56) References Cited

U.S. PATENT DOCUMENTS 5,440,586 A * 8/1995 Den Braber ......... H03D 1/2236
375/327
5,680,381 A * 10/1997 Horimai ................ G11B 7/004
369/116
(Continued)

FOREIGN PATENT DOCUMENTS

| CN | 1472541 A | 2/2004 |
| CN | 104135326 A | 11/2014 |
| WO | WO-2010/031412 | 3/2010 |

OTHER PUBLICATIONS

Extended European Search Report for related EP Patent Application No. 16178366.7, dated Dec. 13, 2016.
(Continued)

*Primary Examiner* — Linda Wong
(74) *Attorney, Agent, or Firm* — Honigman Miller Schwartz and Cohn LLP

(57) ABSTRACT

A method for operating a phase shifter chip RF self-test. The method includes outputting, by control hardware, a first signal from a phased locked loop to a pre-amplifier and an input peak detector, outputting, by the control hardware, a second signal from the pre-amplifier to a device under test, selecting, by the control hardware, a target level, and adjusting, by the control hardware, a pre-amplifier gain of the pre-amplifier to cause the input peak detector value to approximately match the target level. The input peak detector is configured to output an input peak detector value based on the first signal.

14 Claims, 7 Drawing Sheets

(51) Int. Cl.
  *H03G 3/00* (2006.01)
  *H03G 3/20* (2006.01)
  *H03G 3/30* (2006.01)
  *H01Q 3/26* (2006.01)
  *H01Q 3/34* (2006.01)
  *H04B 17/14* (2015.01)
  *H03G 1/00* (2006.01)
  *H03K 5/1532* (2006.01)

(52) U.S. Cl.
  CPC .............. *H03G 3/00* (2013.01); *H03G 3/20* (2013.01); *H03G 3/301* (2013.01); *H03K 5/1532* (2013.01); *H04B 17/14* (2015.01)

(58) Field of Classification Search
  USPC ....... 375/318, 319, 320, 300, 297, 346, 340, 375/344, 347, 354, 376, 375, 373, 371, 375/374, 362
  See application file for complete search history.

(56) References Cited

U.S. PATENT DOCUMENTS

| | | | |
|---|---|---|---|
| 5,887,246 A * | 3/1999 | Chevallier | H03G 3/3068 348/E5.097 |
| 6,449,078 B1 * | 9/2002 | Hirotsune | H04B 10/695 375/345 |
| 6,526,113 B1 * | 2/2003 | Gutierrez | H03L 7/089 327/156 |
| 7,636,013 B2 | 12/2009 | Bach | |
| 7,812,775 B2 | 10/2010 | Babakhani et al. | |
| 8,442,796 B2 | 5/2013 | Smets et al. | |
| 8,692,707 B2 | 4/2014 | Lee et al. | |
| 8,938,207 B2 | 1/2015 | Miyano et al. | |
| 9,350,281 B2 * | 5/2016 | Rodiguez | H02P 9/14 |
| 2005/0001608 A1 | 1/2005 | Peng et al. | |
| 2008/0068236 A1 * | 3/2008 | Sheba | G04F 10/005 341/118 |
| 2008/0191712 A1 | 8/2008 | Eisenstadt et al. | |
| 2008/0233900 A1 | 9/2008 | Baker | |
| 2008/0285549 A1 * | 11/2008 | Behrens | G11B 5/012 370/359 |
| 2011/0050285 A1 * | 3/2011 | Su | G01R 19/04 327/58 |
| 2011/0193483 A1 * | 8/2011 | Mattaboni | G01N 21/73 315/111.21 |
| 2011/0211649 A1 * | 9/2011 | Hahn | H04B 1/525 375/285 |
| 2012/0182077 A1 * | 7/2012 | Yamakawa | H03B 19/00 331/34 |
| 2013/0260699 A1 * | 10/2013 | Fernando | H04B 17/24 455/79 |
| 2014/0256376 A1 | 9/2014 | Weissman et al. | |
| 2014/0355655 A1 * | 12/2014 | Chakraborty | H04B 1/40 375/219 |
| 2015/0036727 A1 | 2/2015 | Kravitz | |
| 2015/0051993 A1 * | 2/2015 | Moshfeghi | G01S 19/48 705/18 |
| 2015/0147992 A1 * | 5/2015 | Khoini-Poorfard | H04B 1/30 455/197.3 |
| 2015/0198661 A1 | 7/2015 | Gerowitz et al. | |
| 2015/0229415 A1 * | 8/2015 | Chen | H04B 17/29 455/67.14 |
| 2015/0326161 A1 * | 11/2015 | Rodriguez | H02P 9/14 322/19 |
| 2016/0077196 A1 * | 3/2016 | Dehlink | G01R 31/2822 342/169 |

OTHER PUBLICATIONS

A CMOS Bidirectional 32-Element Phased-Array Transceiver at 60 GHz With LTCC Antenna, vol. 61, No. 3, Mar. 2013.

Taiwanese Office Action for the related Application No. 150121280 dated Jun. 19, 2017.

* cited by examiner

PHASE SHIFTER CHIP RADIO FREQUENCY SELF-TEST

CROSS REFERENCE TO RELATED APPLICATIONS

This U.S. patent application is a divisional of, and claims priority under 35 U.S.C. §121 from, U.S. patent application Ser. No. 14/817,570, filed on Aug. 4, 2015, which is hereby incorporated by reference in its entirety. U.S. patent application Ser. No. 14/741,870, filed on Jun. 17, 2015 is also hereby incorporated by reference in its entirety.

TECHNICAL FIELD

This disclosure relates to phase shifter chip radio frequency (RF) self-tests.

BACKGROUND

Electronically steered antennas (ESA), also known as phased array antennas, combine multiple individual transmit/receive (T/R) modules which may be implemented as single phase shifter chips and antennas to create a larger effective aperture. The electronically controlled phase and gain relationship between the individual T/R modules controls the radiation pattern and therefore directivity of the synthesized aperture. This control over the radiation pattern can be used for beam steering in air and space-borne communication systems, for target acquisition and tracking or for the synthesis of deep nulls for clutter suppression in radar systems.

SUMMARY

One aspect of the disclosure provides a method for operating a phase shifter chip RF self-test. The method includes selecting, by control hardware, a first output from a phased locked loop, sending, by the control hardware, the first output from the phased locked loop to a first device under test and a second device under test, and adjusting, by the control hardware, a first phase rotator connected to the first device under test to a first rotator phase value of zero. The method also includes determining, by the control hardware, a collection of phase detector values of a phase detector connected to the second device under test by adjusting a second phase rotator connected to the second device under test to sweep through a phase range and measuring the phase detector values of the phase detector. The method further includes determining, by the control hardware, a phase detector gain of the phase detector by averaging the collection of phase detector values and storing, by the control hardware, the phase detector gain in memory hardware.

Implementations of the disclosure may include one or more of the following optional features. In some implementations, the method includes measuring, by the control hardware, the collection of phase detector values with an analog to digital converter. The method may also include turning off, by the control hardware, all signals to the first device under test and the second device under test, and measuring an output of the analog to digital converter to determine an analog to digital converter offset. With all signals to the first device under test and the second device under test enabled adjusting the second phase rotator connected to the second device under test may include adjusting the second phase rotator until a current phase detector value of the phase detector is minimized.

The current phase detector value may be determined by subtracting the analog to digital converter offset from a current output of the analog to digital converter. The phase range may be approximately more than plus or minus four least significant bits. The method may include adjusting, by the control hardware, the second phase rotator to a second rotator phase value of zero, adjusting, by the control hardware, the first phase rotator until the current phase detector value of the phase detector is minimized, and measuring a first phase detector value of the phase detector.

In some implementations, the method includes selecting, by the control hardware, a second output from the phased locked loop that is 90 degrees out of phase from the first output, adjusting, by the control hardware, the second phase rotator to 90 degrees, and measuring a second phase detector value of the phase detector. The method may further include determining, by the control hardware, a quadrature error of the second device under test by subtracting the first phase detector value from the second phase detector value and dividing the subtraction by the phase detector gain. The method may also include measuring a first phase detector value of the phase detector when the current phase detector value of the phase detector is minimized. In some examples, the method includes selecting, by the control hardware, a second output from the phased locked loop, which is 90 degrees out of phase from the first output, adjusting, by the control hardware, the first phase rotator to 90 degrees, and measuring a second phase detector value of the phase detector. The method may further include determining a quadrature error of the first device under test by subtracting the first value from the second value and dividing the subtraction by the phase detector gain.

Another aspect of the disclosure provides a second method for operating a phase shifter chip RF self-test. The method includes outputting, by control hardware, a first signal from a phased locked loop to a pre-amplifier and an input peak detector, outputting, by the control hardware, a second signal from the pre-amplifier to a device under test, selecting, by the control hardware, a target level, and adjusting, by the control hardware, a pre-amplifier gain of the pre-amplifier to cause the input peak detector value to approximately match the target level. The input peak detector is configured to output an input peak detector value based on the first signal.

This aspect may include one or more of the following optional features. The method may include adjusting, by the control hardware, a precision variable gain adjuster connected to the pre-amplifier and measuring an output peak detector value of an output peak detector connected to an output of the device under test. The method may further include adjusting, by the control hardware, a device under test gain of the device under test until the output peak detector value approximately matches the target level. In some examples, the method includes stopping, by the control hardware, all signals to the pre-amplifier and the device under test, measuring, by the control hardware, a current input peak detector value of the input peak detector as an input peak detector offset and measuring a current output peak detector value of the output peak detector as an output peak detector offset.

In some implementations, the method includes determining, by the control hardware, the input peak detector value by subtracting the input peak detector offset from the input peak detector value of the input peak detector. The method may also include determining, by the control hardware, the output peak detector value by subtracting the output peak detector offset from the output peak detector value of the output peak detector. The method may further include measuring the input peak detector value and output peak detector value with an analog to digital converter. The method may also include adjusting, by the control hardware, the precision variable gain adjuster to confirm that the output peak detector value approximately matches the target level within a threshold tolerance.

Yet another aspect of the disclosure provides a system for a phase shifter chip RF self-test. The system includes a phased locked loop having first and second outputs, a first device under test in communication with the phased locked loop, and a second device under test in communication with the first device under test. The first device under test has a first phase rotator, and the second device under test has a second phase rotator. The system further includes a phase detector in communication with at least one of the first device under test or the second device under test and control hardware in communication with the phased locked loop, the first device under test, the second device under test and the phase detector. The control hardware is configured to select the first output from the phased locked loop, send the first output from the phased locked loop to the first device under test and the second device under test, and adjust the first phase rotator to a first rotator phase value of zero. The control hardware is further configured to determine a collection of phase detector values by adjusting the second phase rotator to sweep through a phase range, and measuring the phase detector values of the phase detector. The control hardware is also configured to determine a phase detector gain of the phase detector by averaging the collection of phase detector values.

This aspect may include one or more of the following optional features. The system may further include an analog to digital converter in communication with the phase detector and the control hardware, wherein the control hardware is further configured to measure the collection of phase detector values with the analog to digital converter. The control hardware may be further configured to turn off all signals to the first device under test and the second device under test, and measure an output of the analog to digital converter to determine an analog to digital converter offset. With all signals to the first device under test and the second device under test enabled, adjusting the second phase rotator connected to the second device under test may include adjusting the second phase rotator until a current phase detector value of the phase detector is minimized. The current phase detector value may be determined by subtracting the analog to digital converter offset from a current output of the analog to digital converter. The phase range may be approximately more than plus or minus four least significant bits.

In some examples, the control hardware is further configured to adjust the second phase rotator to a second rotator phase value of zero, adjust the first phase rotator until the current phase detector value of the phase detector is minimized and measure a first phase detector value of the phase detector. The control hardware may be further configured to select a second output from the phased locked loop that is 90 degrees out of phase from the first output, adjust the second phase rotator to 90 degrees, measure a second phase detector value of the phase detector, and determine a quadrature error of the second device under test by subtracting the first phase detector value from the second phase detector value and dividing the subtraction by the phase detector gain. The control hardware is further configured to measure a first phase detector value of the phase detector when the current phase detector value of the phase detector is minimized. The control hardware may be further configured to select a second output from the phased locked loop, which is 90 degrees out of phase from the first output, adjust the first phase rotator to 90 degrees, measure a second phase detector value of the phase detector, and determine a quadrature error of the first device under test by subtracting the first value from the second value and dividing the subtraction by the phase detector gain.

Yet another aspect of the disclosure provides a second system for a phase shifter chip RF self-test. The system includes a phased locked loop, a pre-amplifier in communication with the phased locked loop, an input peak detector in communication with the pre-amplifier, and control hardware in communication with the phased lock loop, the pre-amplifier, and the input peak detector. The control hardware is configured to output a first signal from the phased locked loop to the pre-amplifier and the input peak detector, output a second signal from the pre-amplifier to a device under test, select a target level, and adjust the pre-amplifier gain of the pre-amplifier to cause the input peak detector value to approximately match the target level. The input peak detector is configured to output an input peak detector value based on the first signal.

This aspect may include one or more of the following optional features. The system may include a precision variable gain adjuster connected to the pre-amplifier and an output peak detector connected to an output of the device under test, wherein the control hardware is further configured to adjust the precision variable gain adjuster and measure an output peak detector value of the output peak detector. The control hardware may be further configured to adjust a device under test gain of the device under test until the output peak detector value approximately matches the target level.

In some examples, the control hardware is configured to stop all signals to the pre-amplifier and the device under test, measure a current input peak detector value of the input peak detector as an input peak detector offset and measure a current output peak detector value of the output peak detector as an output peak detector offset. The control hardware may be configured to determine the input peak detector value by subtracting the input peak detector offset from the input peak detector value of the input peak detector and determine the output peak detector value by subtracting the output peak detector offset from the output peak detector value of the output peak detector.

In some examples, the system includes an analog to digital converter in communication with each peak detector. The control hardware may be configured to measure the input peak detector value and output peak detector value with the analog to digital converter. The control hardware may be further configured to adjust the precision variable gain adjuster to confirm that the output peak detector value approximately matches the target level within a threshold tolerance.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

In radio transmission systems, an array of antennas can be used to increase the ability to communicate at greater range and/or increase antenna gain in a direction over individual elements. In a phased array antenna, the phase of individual elements may be adjusted to shape the area of coverage, resulting in longer transmissions or steering the transmission direction without physically moving the array. The shape of the coverage may be adjusted by the alteration of individual elements transmission phase and gain in the array.

Figure 1:
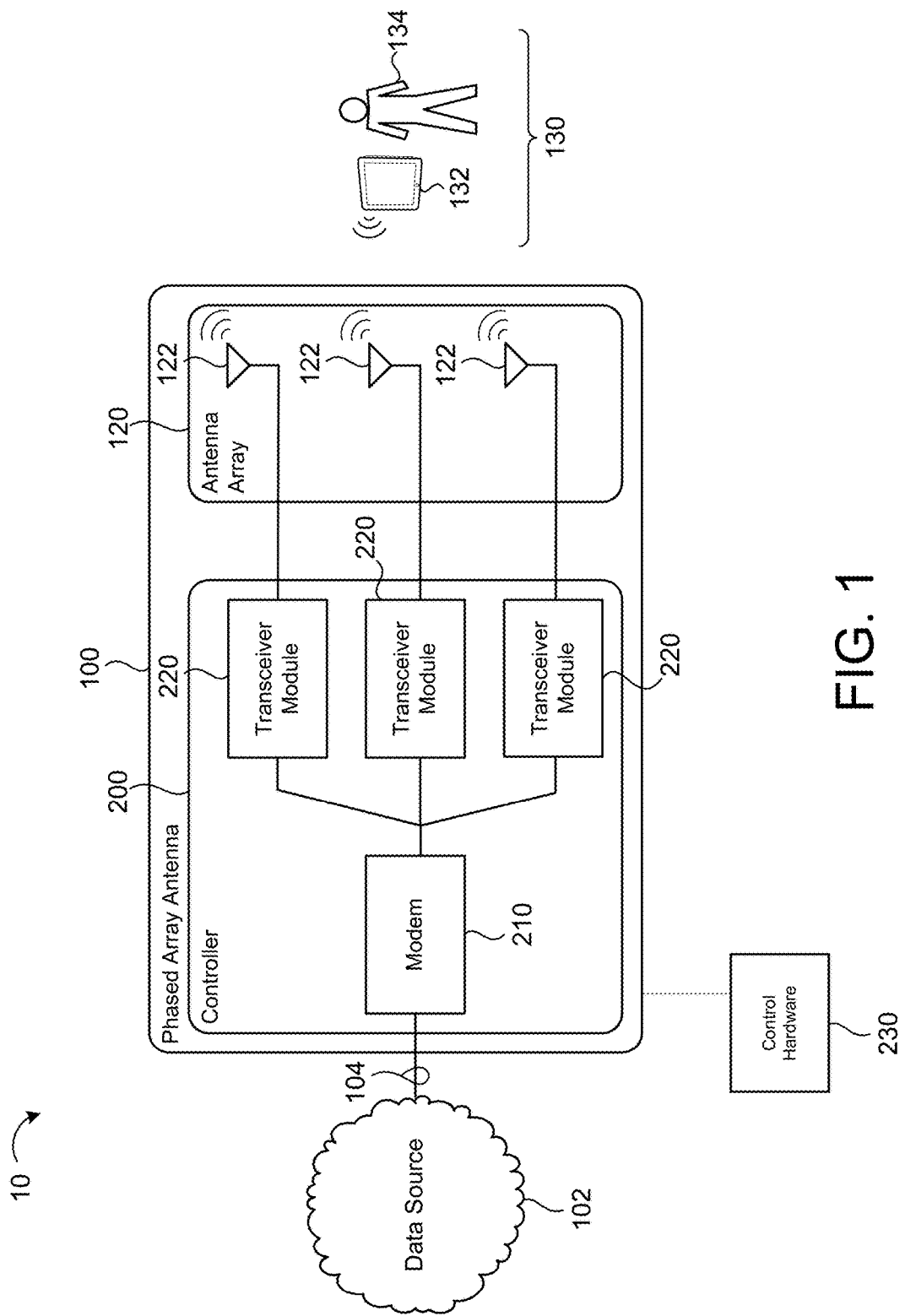
FIG. 1 provides a schematic view of an example phased array antenna system.

FIG. 1 provides a schematic view of an example phased array antenna system 10. The phased array antenna system 10 includes a phased array antenna 100 in communication with a data source 102 and a remote system 130. In the example shown, the phased array antenna 100 includes a controller 200 in communication with an antenna array 120 composed of a plurality of antennas 122. The controller 200 includes a modem 210 in communication with a plurality of transceiver modules 220. The modem 210 receives data 104 from the data source 102 and converts the data 104 into a form suitable to be transmitted to the antenna array 120. For example, the modem 210 converts the data 104 to a signal for transmission or receipt by the transceiver module 220 via electromagnetic energy or radio signals. The antenna array 120 may transmit the electromagnetic energy over the air for receipt by the remote systems 130. The remote systems 130 may include a transceiver device 132 associated with a user 134. The phased array antenna system 10 can also operate in the reverse order, with the remote system 130 transmitting electromagnetic energy to the antenna array 120, which the controller 200 converts to data 104. Connected to the phased array antenna is a collection of control hardware 230. The control hardware 230 includes various systems and processors for controlling the data 104 that is transmitted by the phased array antenna 100 and for implementing various tests and controls on the phased array antenna 100.

Figure 2A:
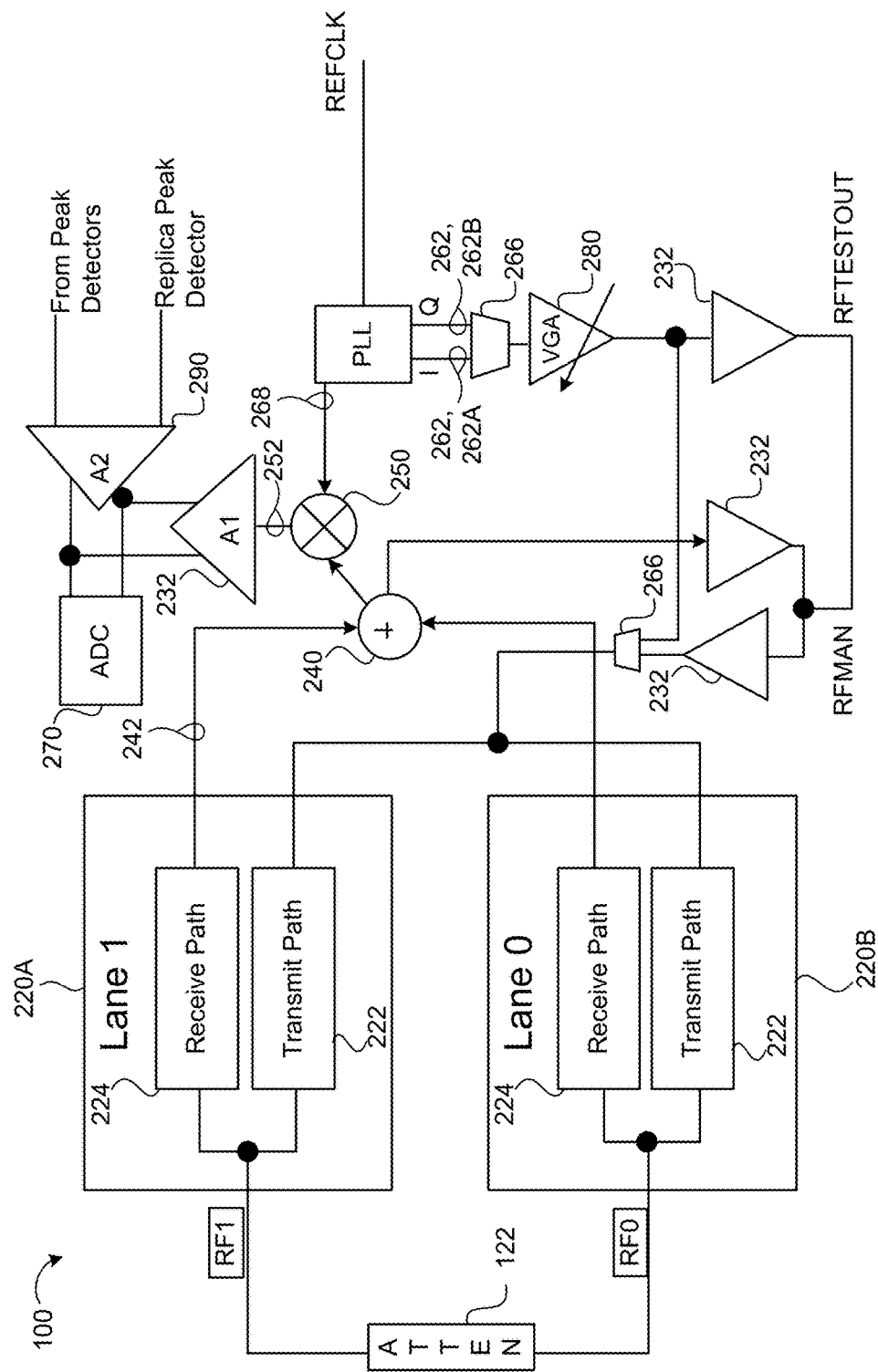
FIG. 2A provides a schematic view of an alternate embodiment of a phased array antenna.

FIG. 2A provides a schematic view of an alternate embodiment of a phased array antenna 100. The phased array antenna 100 includes a first transceiver 220a or first device under test and a second transceiver 220b or second device under test. Both the first transceiver 220a and second transceiver 220b are connected to an antenna 122. Each transceiver 220 includes a transmit module 222 and receive module 224 connected to the antenna 122. The receive module 224 transmits a signal 242 to a summer 240. The summer 240 adds each of the signals 242 received into a single value and transmits the value to the phase detector 250. The phase detector 250 is configured to output a phase detector value 252 corresponding to a phase of the received signal. There are various methods that may be used to create a phase detector 250 and any suitable method is sufficient. In some implementations, the phase detector value 252 is the difference in phase between the signal 242 received from the summer 240 and the reference signal 268 from a phase locked loop (PLL) 260. The phase detector value 252 may be sent through various buffers and or amplifiers 232 to condition the signal to a suitable manner for an Analog to Digital (ADC) 270 converter to read a value from. In some configurations, the ADC 270 is also connected to a peak detector 290 configured to read the peak value of an alternating signal as a direct current value or digital value.

The PLL 260 generates two signals, a first PLL signal 262a and a second PLL signal 262b each of which are 90 degrees out of phase from each other. The frequency of the first PLL signal 262a and the second PLL signal 262b is dependent on the frequency of the phased array antenna 100. A multiplexer or mux device 266 selects which of the first PLL signal 262a or the second PLL signal 262b is sent to a precision variable gain adjuster 280. The precision variable gain adjuster 280 allows precise adjustment of the gain of the first PLL signal 262a or the second PLL signal 262b being sent to the transmit module 222. In some implementations, the first PLL signal 262a or the second PLL signal 262b is fed through various buffers and amplifiers 232 to condition the signal. The mux 266 can select if various buffers and amplifiers 232 are required to condition the first PLL signal 262a or the second PLL signal 262b. The mux 266 sends the first PLL signal 262a or the second PLL signal 262b to each of the transmit modules 222. Each transmit module 222 transmits the first PLL signal 262a or the second PLL signal 262b directly to the receiver module 224 in the same transceiver module 220 and to the antenna 122. In some configurations, the antenna 122 is an attenuator connecting multiple transceiver modules 220 for testing.

Figure 2B:
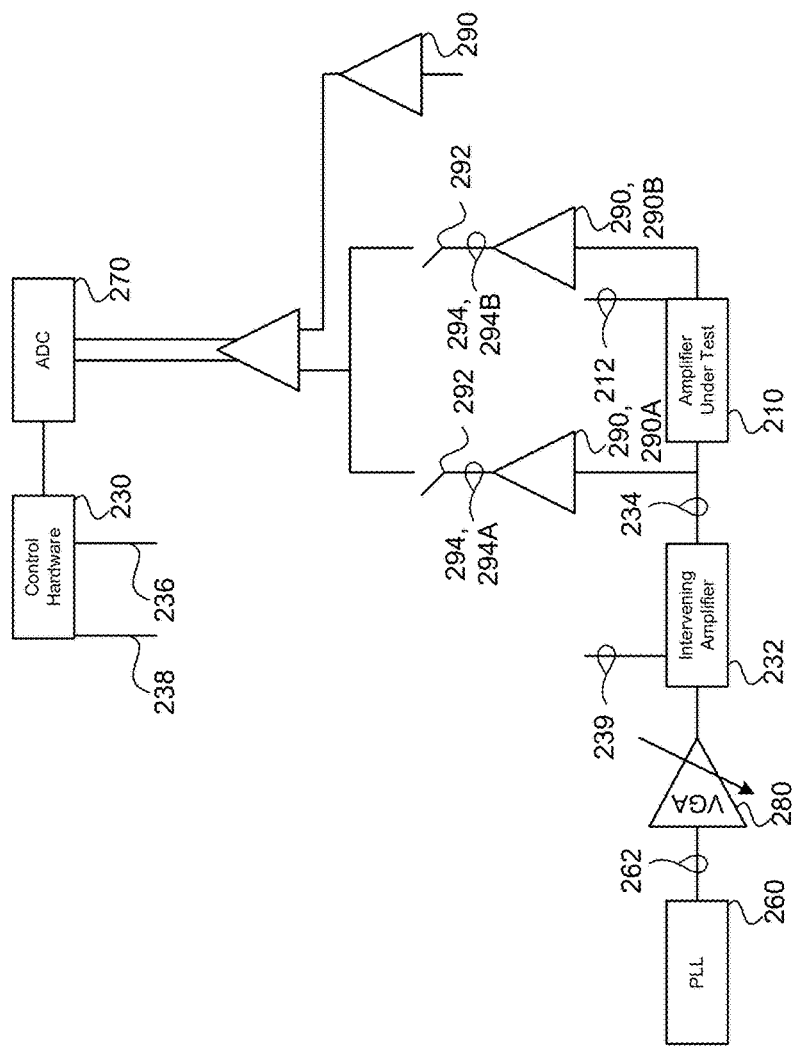
FIG. 2B provides a schematic view of a test system for a phased array antenna with multiple amplifiers and a peak detector.

FIG. 2B provides a schematic view of a test system for a phased array antenna 100 with multiple amplifiers 232 and a peak detector 290. A PLL 260 generates a reference signal 262 and sends the reference signal 262 to a precision variable gain adjuster 280. The precision variable gain adjuster 280 adjusts the gain of the signal to any pre-amplifiers 232 or intervening amplifier 232. The intervening amplifier 232A sends the reference signal 262 to both the input peak detector 290a and the device under test 210. The device under test 210 amplifies the reference signal 262 and sends it to the output peak detector 290b. The input peak detector 290a outputs a peak detector value 294a and the output peak detector 290b outputs an output peak detector value 294b related to the peak value of the reference signal 262 received by the peak detector 290.

Depending on the measurement being taken, either the input peak detector 290a or the output peak detector 290b is selected by a switch 292. The switch 292 allows either the input peak detector value 294a or the output peak detector value 294b to be sent to the ADC 270 to be monitored by the control hardware 230. In some implementations, additional peak detectors 290 are included and their respective peak detector value 294 is sent to the ADC 270.

Testing of the amplifier under test or device under test 210 may begin by turning off the generation of the reference signal 262 by the PLL 260 and measuring the input peak detector value 294a and output peak detector value 294b as the offset value 238. The testing may include selecting a target level 236 and adjusting the pre-amplifiers 232 such that the input peak detector value 294a approximately matches the target level 236. The target level 236 may be selected as a compromise between the performance of the peak detector 290 and the linearity of the amplifier 232. The testing may include adjusting the precision variable gain adjuster 280 through a range to determine the output of the device under test 210 by measuring the output peak detector value 294b. Next, the testing may include adjusting the gain of the device under test 210 and repeating adjustment of the precision variable gain adjuster 280 until the response of the device under test 210 matches the response of the pre-amplifiers 232. In all cases, the respective offset value 238 may be subtracted from the peak detector value 294 to reduce any errors or noise present on the test system.

Figure 2C:
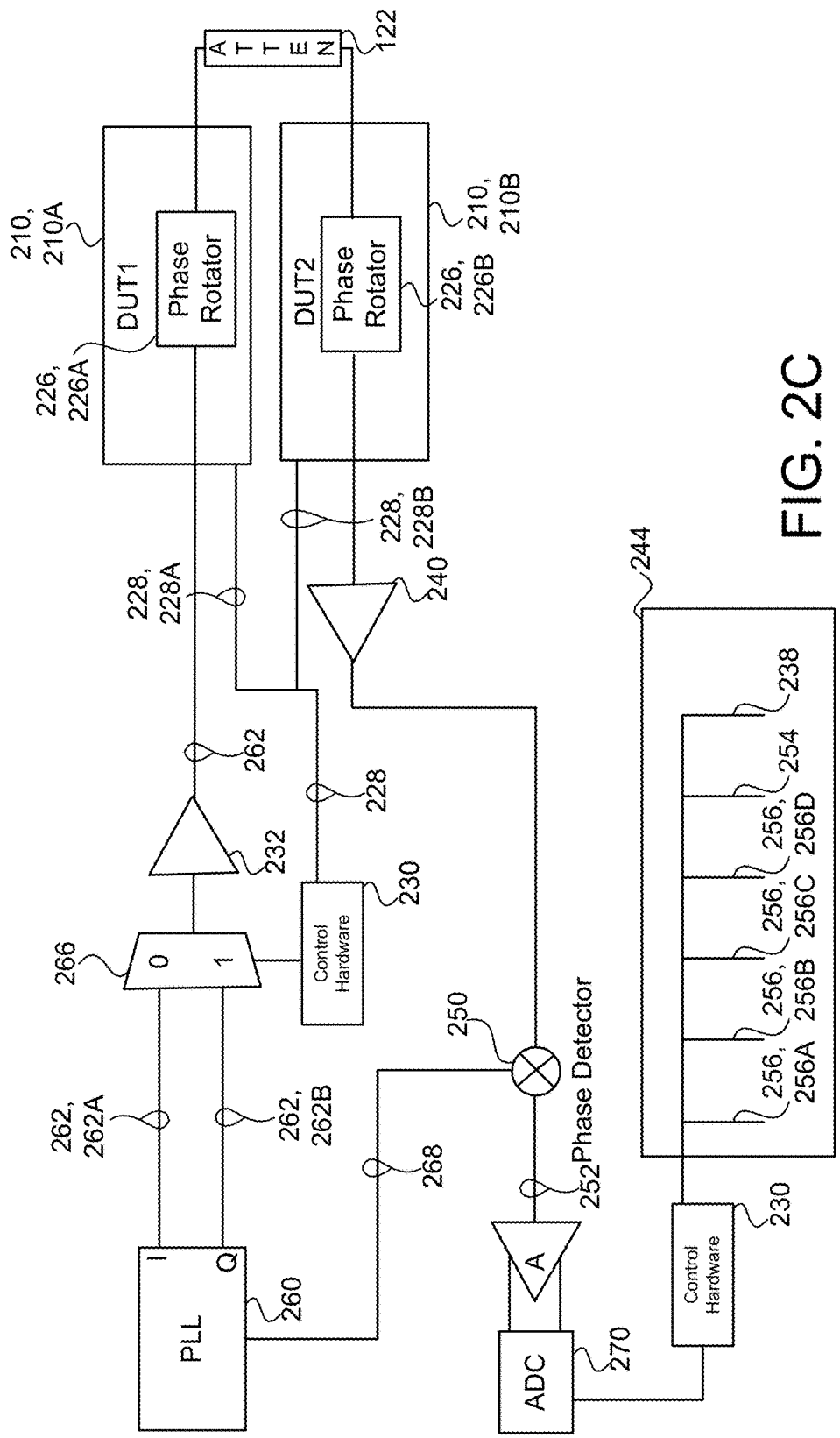
FIG. 2C provides a schematic view of a test system for a phased array antenna with a phase rotator.

FIG. 2C provides a schematic view of a test system for a phased array antenna 100 with a phase rotator 226. A PLL 260 transmits two PLL signals 262, a first PLL signal 262a and a second PLL signal 262b to a mux 266. The PLL 260 may transmit a reference signal 268 to the phase detector 250. The second PLL signal 262b is 90 degrees out of phase from the first PLL signal 262a. The mux 266 may select either the first PLL signal 262a or the second PLL signal 262b to send to the amplifiers 232. The mux 266 may be controlled by the control hardware 230. The amplifiers 232 transmit the PLL signal 262 to a first device under test 210a. The first device under test 210a includes a first phase rotator 226a. The phase rotator 226 is controllable to adjust the phase angle of the PPL signal 262. After the phase rotator 226 has adjusted the phase of the PLL signal 262, the first phase rotator 226a sends the PLL signal 262 to the attenuator 122.

The attenuator 122 sends the PLL signal 262 to a second device under test 210b. The second device under test 210b includes a second phase rotator 226b. The second phase rotator 226b adjusts the phase of the PLL signal 262 received from the attenuator 122. After the second phase rotator 262b has adjusted the phase of the PLL signal 262, the second phase rotator 226b transmits the PLL signal 262 to a summer 240. The summer 240 transmits the PLL signal 262 to the phase detector 250. The phase detector 250 compares the difference in phase between the PLL signal 262 and the reference signal 268. The phase detector 250 transmits a phase detector value 252 to an ADC 270. The ADC 270 converts the phase detector value 252 to a value read by the control hardware 230. In some implementations, the control hardware 230 adjusts the phase rotator value 228. The control hardware 230 may adjust the first phase rotator 226a by adjusting the first phase rotator value 228a, and the second phase rotator 226b by adjusting the second phase rotator value 228b. Various values, such as the target value or target level 236, offset value 238, phase detector gain 254, or value 256 may be stored in memory hardware 244 for later use.

The various devices under test 210 may be calibrated by the following steps. First, the PLL 260 is turned off and the ADC 270 measures the phase detector value 252 as an offset value 238. The PLL 260 is turned on by transmitting a reference signal 268 and a PLL signal 262. The control hardware 230 directs the mux 266 to select the second PLL signal 262b and sets the second phase rotator value 228b to zero. The control hardware 230 sweeps the first phase rotator value 228a until the phase detector value 252 is minimized after subtracting the offset value 238. The control hardware 230 next sweeps the second phase rotator value 228b in increments of one least significant bit and determines the phase detector gain 254 by averaging the phase detector values 250 of the sweep.

Next, the control hardware 230 sets the second phase rotator value 228b to zero and adjusts the first phase rotator value 228b until the phase detector value 252 is minimized after subtracting out the offset 238. The minimized phase detector value 252 may be stored as a first value 256a. The control hardware 230 directs the mux 266 to select the first PLL signal 262a that is 90 degrees out of phase from the second PLL signal 262b. The control hardware 230 adjusts the second phase rotator value 228b to 90 degrees. The control hardware 230 measures the phase detector value 252 and subtracts the offset 238 and the phase detector value 252 may be stored as the second value 256b. The error of the second device under test 210b is determined by the difference between the first value 256a and the second value 256b. The resulting difference is divided by the phase detector gain 254 to determine the quadrature error of the second device under test 210b.

The control hardware 230 sets the mux 266 to transmit the second PLL signal 262b and sets the first phase rotator value 228a to zero. The control hardware 230 adjusts the second phase rotator value 228 to minimize the phase detector value 252. The value may be stored as a third value 256c. The control hardware 230 directs the mux 266 to select the first PLL signal 262a that is 90 degrees out of phase from the second PLL signal 262b. The control hardware 230 adjusts the second phase rotator value 228a to 90 degrees. The control hardware 230 measures the phase detector value 252 and subtracts the offset 238. The resulting phase detector value 252 may be stored as a fourth value 256d. The error of the first device under test 210a is determined by the difference between the third value 256c and the fourth value 256d. The resulting difference is divided by the phase detector gain 254 to determine the quadrature error of the first device under test 210a.

Figure 3:
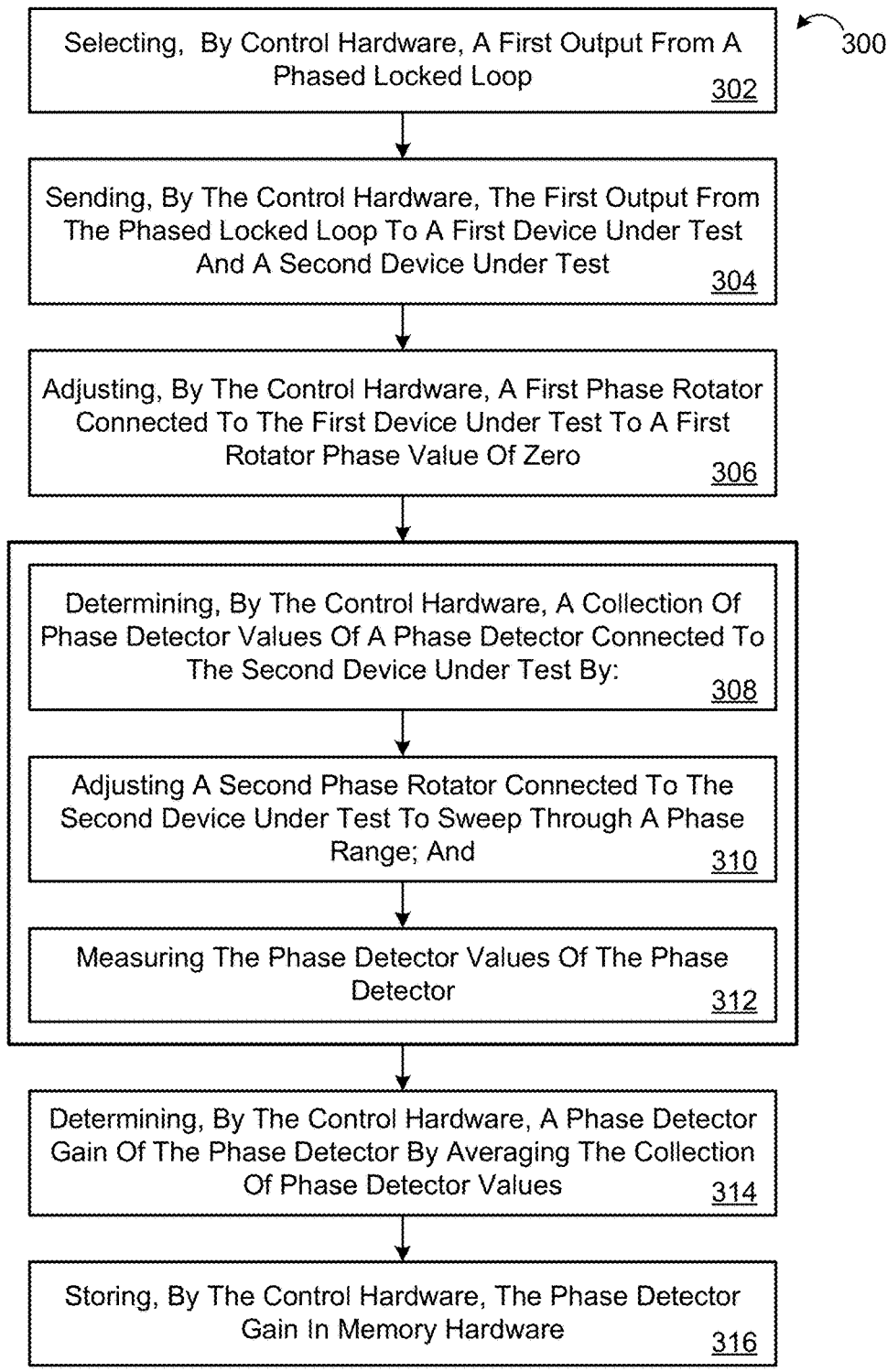
FIG. 3 shows a method for calibrating a device under test in a phased array antenna.

FIG. 3 shows a method 300 for calibrating a device under test 210 in a phased array antenna 100. At block 302, the method 300 includes selecting, by control hardware 230, a first output or first PLL signal 262a from a phased locked loop (PLL) 260. A mux 266 controlled by the control hardware 230 allows the PLL signal 262 to be selected and transmitted to a device under test 210. At block 304, the method 300 includes sending, by the control hardware 230, the first output or first PLL signal 262a from the phased locked loop 260 to a first device under test 210a and a second device under test 210b. The PLL 260 transmits a first PLL signal 262a to act as a calibration signal to the first device under test 210a. At block 306, the method 300 includes adjusting, by the control hardware 230, a first phase rotator 226a connected to the first device under test 210 to a first rotator phase value or first phase rotator value 228a of zero. The control hardware 230 transmits a first phase rotator value 228a to the first phase rotator 226a to set its phase rotation of the first PLL signal 262a to zero degrees. At block 308, the method 300 includes determining, by the control hardware 230, a collection of phase detector values 252 of a phase detector 250 connected to the second device under test 210b. The control hardware 230 measures the phase detector value 252 produced by the phase detector 250. In at least one example, the phase detector value 252 is measured by an ADC 270. At block 310, the method 300 includes collection of phase detector values 252 by adjusting a second phase rotator 226b connected to the second device under test 210b to sweep through a phase range. The control hardware 230 may make various adjustments of the second phase rotator 226b by sending various second phase rotator values 228. At block 312, the method 300 includes collection of phase detector values 252 by measuring the phase detector values 252 of the phase detector 250. As the control hardware 230 adjusts the second phase rotator values 228b the resulting phase detector value 252 from the phase detector 250 is measured. At block 314, the method 300 includes determining, by the control hardware 230, a phase detector gain 254 of the phase detector 250 by averaging the collection of phase detector values 252. Each of the collected phase detector values 252 are collected and averaged over the sample range of phase rotator values 228. In some examples, the range of phase rotator values 228 is incremented in increments of one least significant bit. The range of phase rotator values may be plus or minus four least significant bits. At block 316, the method 300 includes collection of phase detector values 252 by storing, by the control hardware 230, the phase detector gain 254 in the memory hardware 244.

In some implementations, the method 300 includes, by the control hardware 230, measuring the collection of phase detector values 252 with an analog to digital converter 270. The method 300 may also include turning off, by the control hardware 230, all signals to the first device under test 210a and the second device under test 210b, and measuring an output of the analog to digital converter 270 to determine an analog to digital converter offset 238. Then, with all signals to the first device under test and the second device under test enabled, adjusting the second phase rotator 226b connected to the second device under test 210b may include adjusting the second phase rotator 226b until a current phase detector value 252 of the phase detector 250 is minimized.

The current phase detector value 252 may be determined by subtracting the analog to digital converter offset 238 from a current output of the analog to digital converter 270. The method 300 may include adjusting, by the control hardware 230, the second phase rotator 226b to a second phase rotator value 228b of zero, adjusting, by the control hardware 230, the first phase rotator 226a until the current phase detector value 252 of the phase detector 250 is minimized, and measuring a first phase detector value 252 of the phase detector 250.

In some implementations, the method 300 includes selecting, by the control hardware 230, a second output or second PLL signal 262b from the phased locked loop 260 that is 90 degrees out of phase from the first output or first PLL output 262a, adjusting, by the control hardware 230, the second phase rotator 226b to 90 degrees, and measuring a second phase detector value 252 of the phase detector 250. The method 300 may further include determining, by the control hardware 230, a quadrature error of the second device under test 210b by subtracting the first phase detector value 252 from the second phase detector value 252 and dividing the subtraction by the phase detector gain 254. The method 300 may also include measuring a first phase detector value 252 of the phase detector 250 when the current phase detector value 252 of the phase detector 250 is minimized. In some examples, the method 300 includes selecting, by the control hardware 230, a second output or second PLL signal 262b from the phased locked loop 260, which is 90 degrees out of phase from the first output or first PLL signal 262a, adjusting, by the control hardware 230, the first phase rotator 226a to 90 degrees, and measuring a second phase detector value 252 of the phase detector 250. The method 300 may further include determining a quadrature error of the first device under test 210a by subtracting the first value 256a from the second value 256b and dividing the subtraction by the phase detector gain 254.

Figure 4:
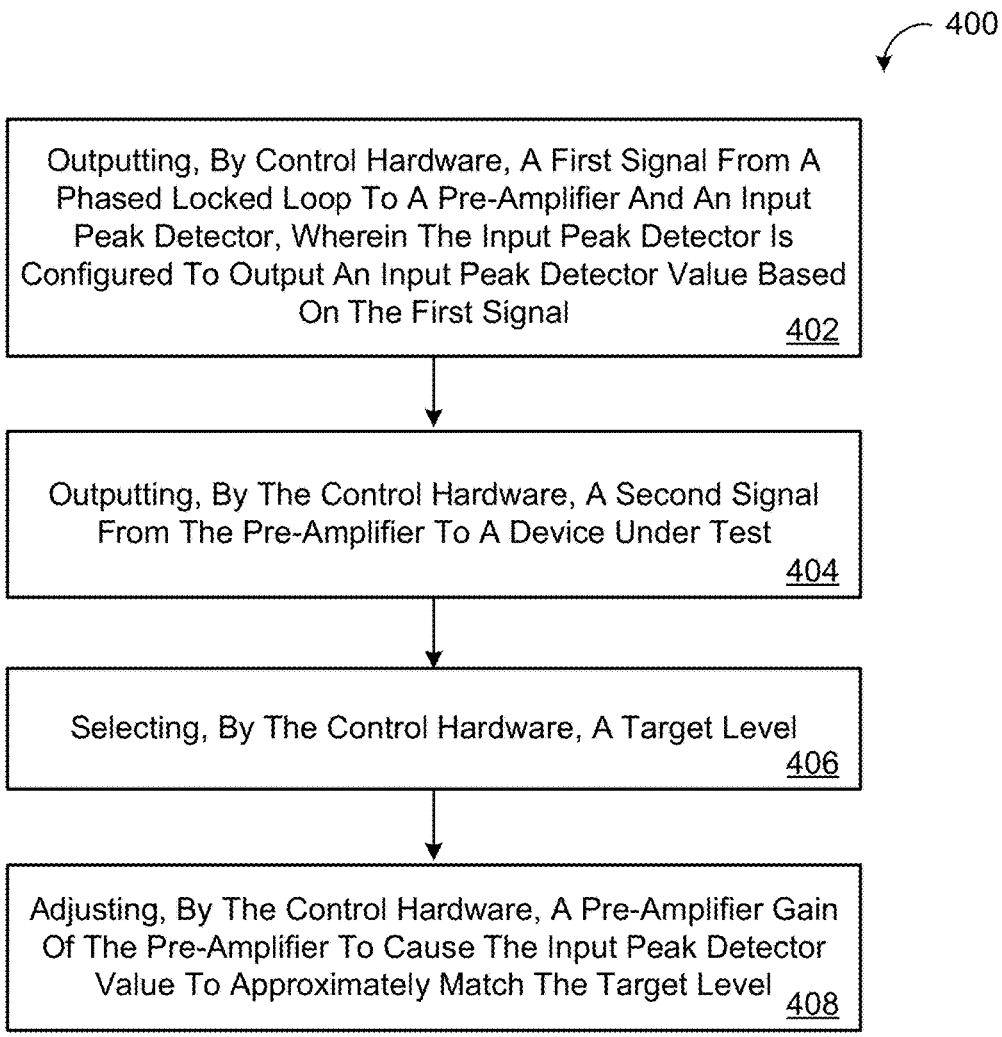
FIG. 4 shows an alternate method for calibrating a device under test in a phased array antenna.

FIG. 4 shows a method 400 for calibrating a device under test 210 in a phased array antenna 100. At block 402, the method 400 includes outputting, by control hardware 230, a first signal or PLL signal 262 from a phased locked loop 260 to a pre-amplifier or general amplifier 232 and an input peak detector 290a. The PLL 260 transmits a PLL signal 262 to the amplifier 232 and to an input peak detector 290a. At block 404, the method 400 includes outputting, by the control hardware 230, a second signal 234 or PLL signal 262 from the pre-amplifier or amplifier 232 to a device under test 210. The amplifier 232 modifies the signal or PLL signal 262 and outputs the second signal 234 to the input peak detector 290a after amplifying the signal or PLL signal 262. At block 406, the method 400 includes selecting, by the control hardware 230, a target level 236. The target level 236 may be selected as a compromise between the peak detector performance 290 and the linearity of the amplifier 232. At block 408, the method 400 includes adjusting, by the control hardware 230, a pre-amplifier gain 239 of the pre-amplifier or amplifier 232 to cause the input peak detector value 294a to approximately match the target level 236.

The method 400 may include adjusting, by the control hardware 230, a precision variable gain adjuster 280 connected to the pre-amplifier 232 and measuring an output peak detector value 294b of an output peak detector 290b connected to an output of the device under test 210. The method 400 may further include adjusting, by the control hardware 230, a device under test gain 212 of the device under test 210 until the output peak detector value 294b approximately matches the target level or target value 236. In some examples, the method 400 includes stopping, by the control hardware, all signals to the pre-amplifier 232 and the device under test 210, measuring, by the control hardware 230, a current input peak detector value 294a of the input peak detector 290a as an input peak detector offset or offset value 238 and measuring a current output peak detector value 294b of the output peak detector 290b as an output peak detector offset or offset value 238.

In some implementations, the method 400 includes determining, by the control hardware 230, the input peak detector value 294a by subtracting the input peak detector offset or offset value 238 from the input peak detector value 294a of the input peak detector 290a. The method 400 may also include determining, by the control hardware 230, the output peak detector value 294b by subtracting the output peak detector offset or offset value 238 from the output peak detector value 294b of the output peak detector 290b. The method 400 may further include measuring the input peak detector value 294a and output peak detector value 294b with an analog to digital converter 270. The method 400 may also include adjusting, by the control hardware 230, the precision variable gain adjuster 280 to confirm that the output peak detector value 294b approximately matches the target level or target value 236 within a threshold tolerance.

Figure 5:
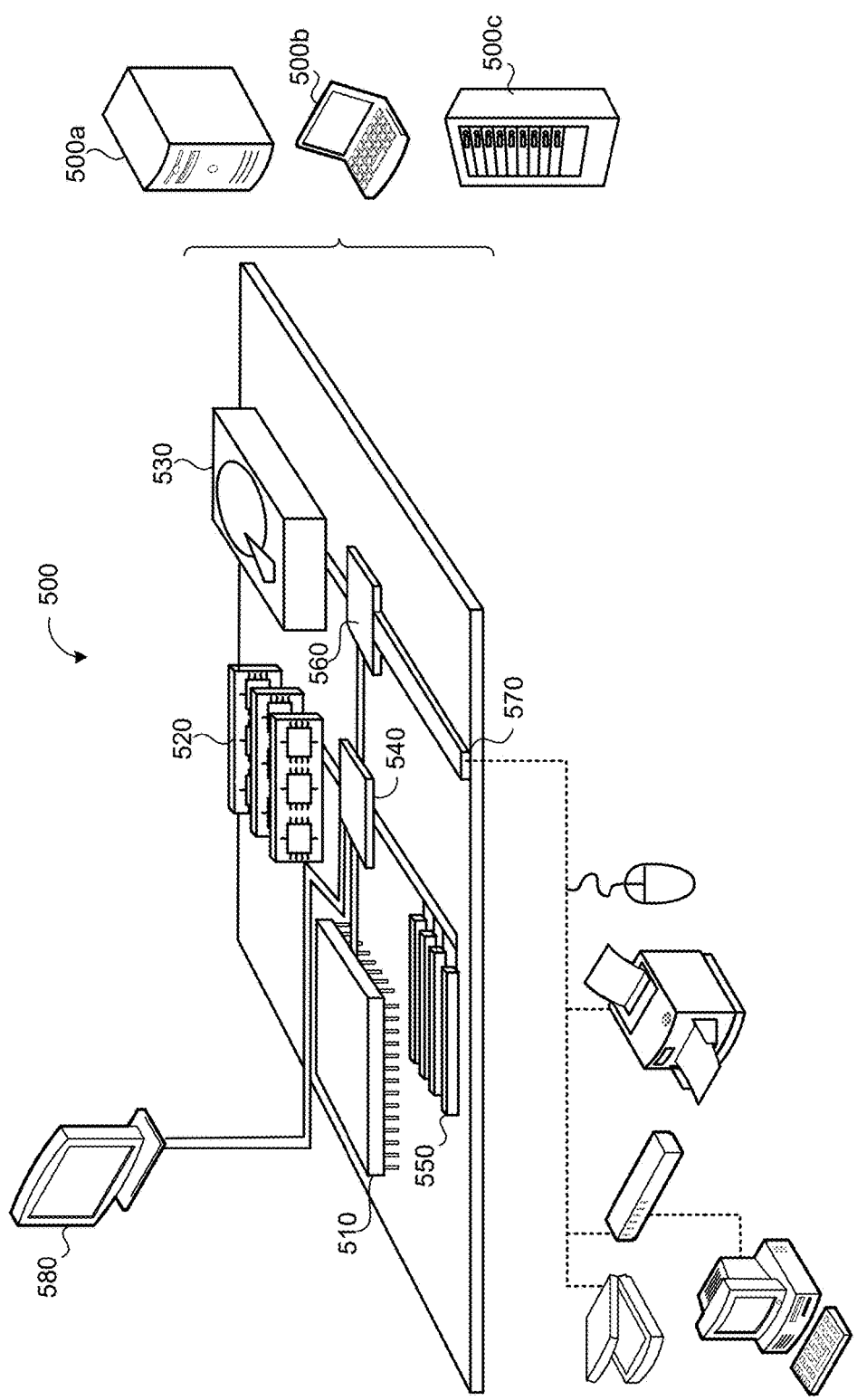
FIG. 5 is a schematic view of an example computing device that may be used to implement the systems and methods described in this document.

FIG. 5 is schematic view of an example computing device 500 that may be used to implement the systems and methods described in this document. The computing device 500 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 500 includes a processor 510, memory 520, a storage device 530, a high-speed interface/controller 540 connecting to the memory 520 and high-speed expansion ports 550, and a low speed interface/controller 560 connecting to low speed bus 570 and storage device 530. Each of the components 510, 520, 530, 540, 550, and 560, are interconnected using various busses, and may be mounted on a common motherboard or in other manners as appropriate. The processor 510 can process instructions for execution within the computing device 500, including instructions stored in the memory 520 or on the storage device 530 to display graphical information for a graphical user interface (GUI) on an external input/output device, such as display 580 coupled to high speed interface 540. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 520 stores information non-transitorily within the computing device 500. The memory 520 may be a computer-readable medium, a volatile memory unit(s), or non-volatile memory unit(s). The non-transitory memory 520 may be physical devices used to store programs (e.g., sequences of instructions) or data (e.g., program state information) on a temporary or permanent basis for use by the computing device 500. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 530 is capable of providing mass storage for the computing device 500. In some implementations, the storage device 530 is a computer-readable medium. In various different implementations, the storage device 530 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer—or machine-readable medium, such as the memory 520, the storage device 530, or memory on processor 510.

The high speed controller 540 manages bandwidth-intensive operations for the computing device 500, while the low speed controller 560 manages lower bandwidth-intensive operations. Such allocation of duties is exemplary only. In some implementations, the high-speed controller 540 is coupled to the memory 520, the display 580 (e.g., through a graphics processor or accelerator), and to the high-speed expansion ports 550, which may accept various expansion cards (not shown). In some implementations, the low-speed controller 560 is coupled to the storage device 530 and low-speed expansion port 570. The low-speed expansion port 570, which may include various communication ports (e.g., USB, Bluetooth, Ethernet, wireless Ethernet), may be coupled to one or more input/output devices, such as a keyboard, a pointing device, a scanner, or a networking device, such as a switch or router, e.g., through a network adapter.

The computing device 500 may be implemented in a number of different forms, as shown in the figure. For example, it may be implemented as a standard server 500a or multiple times in a group of such servers 500a, as a laptop computer 500b, or as part of a rack server system 500c.

Various implementations of the systems and techniques described here can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A method comprising:
    outputting, by control hardware, a first signal from a phased locked loop to a pre-amplifier and an input peak detector, wherein the input peak detector is configured to output an input peak detector value based on the first signal;
    outputting, by the control hardware, a second signal from the pre-amplifier to a device under test;
    selecting, by the control hardware, a target level; and
    adjusting, by the control hardware, a pre-amplifier gain of the pre-amplifier to target the input peak detector value to match the selected target level.

2. The method of claim 1, further comprising:
    adjusting, by the control hardware, a precision variable gain adjuster connected to the pre-amplifier; and measuring an output peak detector value of an output peak detector connected to an output of the device under test.

3. The method of claim 2, further comprising adjusting, by the control hardware, a device under test gain of the device under test until the output peak detector value matches the selected target level.

4. The method of claim 3, further comprising:
stopping, by the control hardware, all signals to the pre-amplifier and the device under test;
measuring, by the control hardware, a current input peak detector value of the input peak detector as an input peak detector offset; and
measuring a current output peak detector value of the output peak detector as an output peak detector offset.

5. The method of claim 4, further comprising determining, by the control hardware, the input peak detector value by subtracting the input peak detector offset from the input peak detector value of the input peak detector.

6. The method of claim 4, further comprising determining, by the control hardware, the output peak detector value by subtracting the output peak detector offset from the output peak detector value of the output peak detector.

7. The method of claim 4, further comprising measuring the input peak detector value and output peak detector value with an analog to digital converter.

8. The method of claim 4, further comprising adjusting, by the control hardware, the precision variable gain adjuster to confirm that the output peak detector value matches the selected target level within a threshold tolerance.

9. A system comprising:
a phased locked loop;
a pre-amplifier in communication with the phased locked loop;
an input peak detector in communication with the pre-amplifier; and
control hardware in communication with the phased lock loop, the pre-amplifier, and the input peak detector, the control hardware configured to:
output a first signal from the phased locked loop to the pre-amplifier and the input peak detector, wherein the input peak detector is configured to output an input peak detector value based on the first signal;
output a second signal from the pre-amplifier to a device under test;
select a target level; and
adjust the pre-amplifier gain of the pre-amplifier to target the input peak detector value to match the selected target level.

10. The system of claim 9, further comprising:
a precision variable gain adjuster connected to the pre-amplifier; and
an output peak detector connected to an output of the device under test,
wherein the control hardware is further configured to:
adjust the precision variable gain adjuster; and
measure an output peak detector value of the output peak detector.

11. The system of claim 10, wherein the control hardware is further configured to adjust a device under test gain of the device under test until the output peak detector value matches the selected target level.

12. The system of claim 11, wherein the control hardware is further configured to: stop all signals to the pre-amplifier and the device under test;
measure a current input peak detector value of the input peak detector as an input peak detector offset;
measure a current output peak detector value of the output peak detector as an output peak detector offset;
determine input peak detector value by subtracting the input peak detector offset from the input peak detector value of the input peak detector; and
determine the output peak detector value by subtracting the output peak detector offset from the output peak detector value of the output peak detector.

13. The system of claim 12, further comprising an analog to digital converter in communication with each of the input peak detector and the output peak detector, the control hardware further configured to measure the input peak detector value and output peak detector value with the analog to digital converter.

14. The system of claim 12, wherein the control hardware is further configured to adjust the precision variable gain adjuster to confirm that the output peak detector value matches the selected target level within a threshold tolerance.

* * * * *